United States Patent
Wang et al.

(10) Patent No.: US 11,474,554 B2
(45) Date of Patent: Oct. 18, 2022

(54) CIRCUIT FOR PROVIDING CLOCK TO DE-SERIALIZER IN COMMUNICATION PHYSICAL LAYER

(71) Applicants: Global Unichip Corporation, Hsinchu (TW); Taiwan Semiconductor Manufacturing Company, Ltd., Hsinchu (TW)

(72) Inventors: Ting-Hao Wang, Hsinchu (TW); Ting-Chin Cho, Hsinchu (TW); Hui-Ting Yang, Hsinchu (TW); Yung-Sheng Fang, Hsinchu (TW); Igor Elkanovich, Hsinchu (TW); Amnon Parnass, Hsinchu (TW); Chiung-Chi Lin, Hsinchu (TW); Ming-Fu Tsai, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 24 days.

(21) Appl. No.: 17/147,405

(22) Filed: Jan. 12, 2021

(65) Prior Publication Data
US 2022/0221893 A1  Jul. 14, 2022

(51) Int. Cl.
| | | |
|---|---|---|
| *G06F 1/08* | (2006.01) | |
| *H03L 7/081* | (2006.01) | |
| *G06F 13/42* | (2006.01) | |
| *H03K 5/06* | (2006.01) | |

(52) U.S. Cl.
CPC ............ *G06F 1/08* (2013.01); *G06F 13/4291* (2013.01); *H03K 5/06* (2013.01); *H03L 7/0814* (2013.01)

(58) Field of Classification Search
CPC ......... G06F 1/08; G06F 13/4291; H03K 5/06; H03L 7/0814
See application file for complete search history.

(56) References Cited

U.S. PATENT DOCUMENTS

| | | |
|---|---|---|
| 7,139,348 B1 | 11/2006 | Fu et al. |
| 9,766,288 B2 | 9/2017 | Huang et al. |
| 10,037,293 B2 | 7/2018 | Chen et al. |
| 10,127,169 B2 | 11/2018 | Su |
| 10,152,445 B2 | 12/2018 | Su |
| 10,261,928 B2 | 4/2019 | Chen et al. |
| 10,411,719 B1 * | 9/2019 | Elliott .................. H03L 7/0992 |

(Continued)

FOREIGN PATENT DOCUMENTS

TW    I459179    11/2014

OTHER PUBLICATIONS

Office Action of Taiwan Counterpart Application, dated Jun. 23, 2021, pp. 1-6.

*Primary Examiner* — Glenn A. Auve
(74) *Attorney, Agent, or Firm* — JCIPRNET

(57) ABSTRACT

A circuit is provided for providing a sampling clock to de-serializers in a communication physical layer. The circuit includes a slave delay lock loop (DLL), to receive an input clock and provide the sampling clock to the de-serializers. Further, a master DLL is included for receiving the input clock and outputting a control signal to the slave DLL to adjust a delay amount of the sampling clock of the slave DLL. The master DLL replicates a circuit of the slave DLL with a loop detection and determines the control signal for output.

18 Claims, 10 Drawing Sheets

(56) References Cited

U.S. PATENT DOCUMENTS

2013/0342251 A1   12/2013  Patel et al.
2017/0237442 A1*   8/2017  Kim ........................ G11C 7/00
                                                      327/142
2017/0373696 A1*  12/2017  Vasudevan ............. G11C 7/222

* cited by examiner

FIG. 5

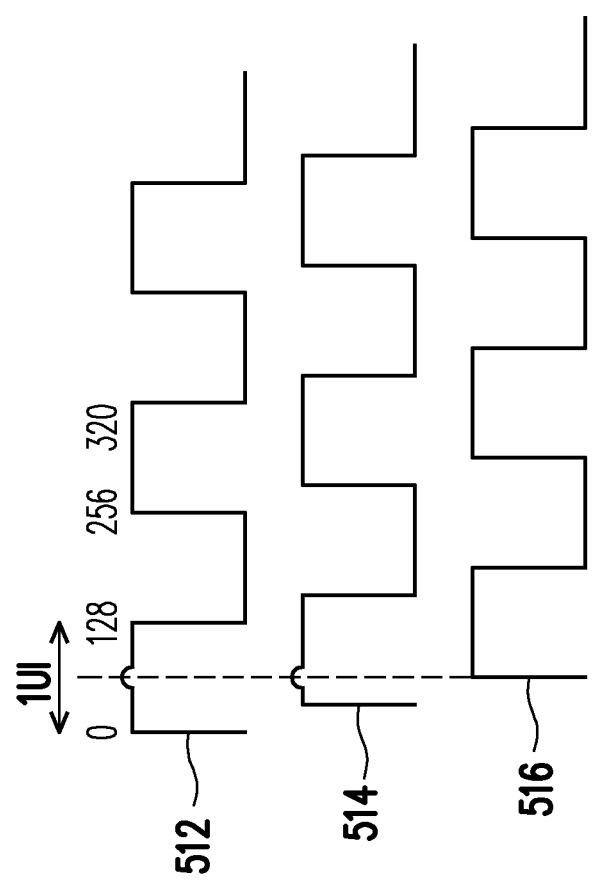

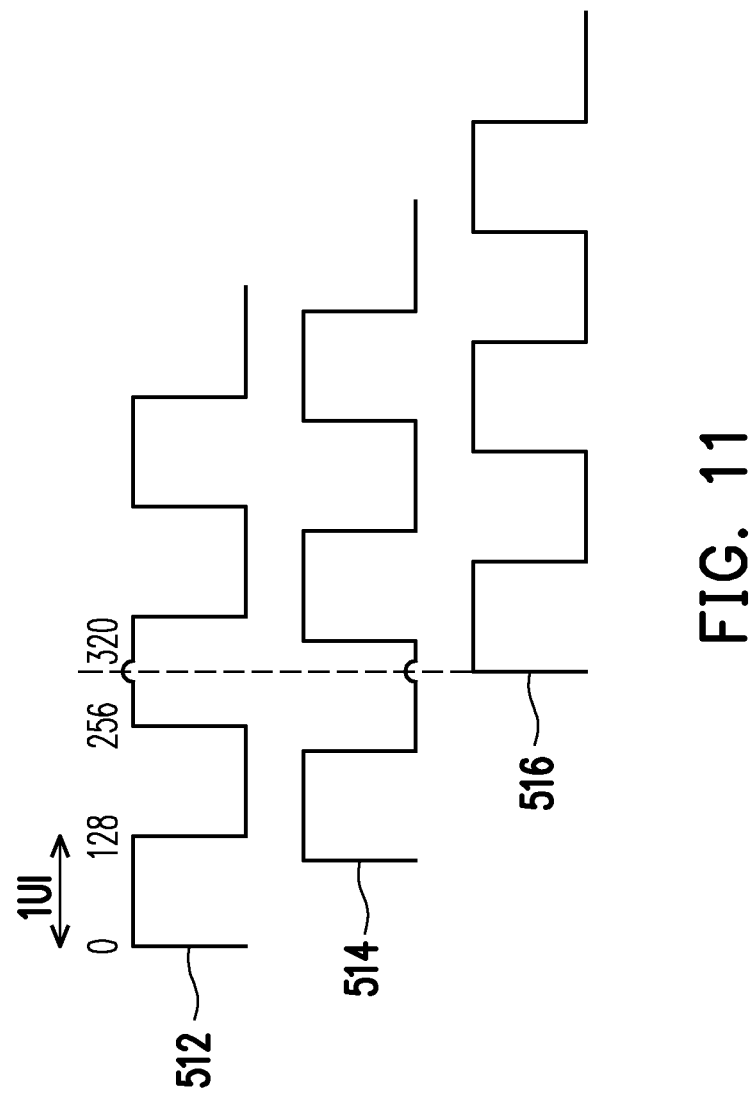

CIRCUIT FOR PROVIDING CLOCK TO DE-SERIALIZER IN COMMUNICATION PHYSICAL LAYER

BACKGROUND

Technical Field

The invention is related to interface between two integrated circuit (IC) dies for data communication and more particularly to a circuit for providing a clock to de-serializers, which uses the clock to sample the serial data into parallel data.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or re-distribution layer (RDL) are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit may be fabricated based on the 2.5D packaging technology. In addition, multiple application-specific integrated circuits (ASIC) dies and serializer/deserialized (SerDes) dies may be additionally disposed on the main circuit in connection with each other through the interconnection interfaces, which involves a parallel bus.

The interfaces of two dies to be connected usually include contact element patterns, respectively, for connection to each other. The contact element pattern of a die includes a plurality of contact elements for connection to the contact elements of another die.

In communication, the contact elements of one die are connecting with contact elements of another die in parallel communication. Here, the communication physical layer in each die usually includes serializers to convert the parallel data into serial data. A set of serial data is transmitted to another die through one contact element. Then, the communication physical layer also includes de-serializer to convert the serial data into parallel data.

The de-serializers need a proper clock signal to correctly sample the serial data in analog signal into the parallel digital data. How to provide the proper clock signal used in the de-serializer is still an issue in circuit design.

SUMMARY

The invention provides a clock to de-serializers in a communication physical layer, in which the de-serializer uses the clock to properly sample the serial data and the de-serialize the serial data into parallel data.

The invention provides a circuit for providing a sampling clock to de-serializers in a communication physical layer. The circuit includes a slave delay lock loop (DLL), to receive an input clock and provide the sampling clock to the de-serializers. Further, a master DLL is included for receiving the input clock and outputting a control signal to the slave DLL to adjust a delay amount of the sampling clock of the slave DLL. The master DLL replicates a circuit of the slave DLL with a loop detection and determines the control signal for output.

The invention also provides a communication physical layer, which includes a plurality of buffers, parallelly receiving an input clock and a plurality of data signals from an external die through a connection interface, each of the data signals containing a set of serial data. In addition, a delay lock loop (DLL) circuit receives the input clock, to provide a sampling clock. A plurality of de-serializers respectively receives the data signals and the sampling clock to de-serialize the set of serial data. The DLL circuit includes a slave DLL, to receive the input clock and provide the sampling clock to the de-serializers; and a master DLL to receive the input clock and output a control signal to the slave DLL to adjust a delay amount of the sampling clock of the slave DLL. The master DLL replicates a circuit of the slave DLL with a loop detection and determines the control signal for output.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5 is a drawing, schematically illustrating the structure of the contact element pattern, according to an embodiment of the invention.

FIG. 10 and FIG. 11 are drawings, schematically illustrating the adjustment effect of the clock, according to an embodiment of the invention.

DESCRIPTION OF THE EMBODIMENTS

The invention is directed to an interface between two integrated circuit (IC) dies for data communication. The contact elements of the two dies are correspondingly connected through connection interface, such as interposer or re-distribution layer (RDL) depending on the package process as taken. The parallel data of one die are serialized into serial data and then transmitted to a target die through the connection interface. The serial data as received by the target die need to be de-serialized into parallel data. The clock used in the de-serializers is also transmitted though one or more contact elements of the connection interface. In an embodiment, clock may be also transferred as differential pair using two contact elements. The phase of the clock needs to be properly adjusted, so as to correctly sample the serial data to de-serialize into parallel data.

The phase adjustment for the clock for the de-serializers is essential to assure the data to be correctly de-serialized. Multiple embodiments are provided for describing the invention but the invention is not just limited to the embodiments.

The packaging structure between dies fabricated as a semiconductor device is described first. At to the semiconductor fabrication, the interface for a 2.5D semiconductor device may be taken, in which dies are disposed on an interposer or RDL. The contact element patterns of the dies are configured to have geometrically symmetric relation. The dies are more freely connected through the interface. The routing lengths between contact elements in routing may also be more equally and shortly set.

In communication through the interface, the parallel data at the transmitting die usually are serialized into bit string in serial form. Various signals including the bit string are transmitted to another die, as a receiving die, through the interface. The interface provides a parallel bus for transmitting the signals in serial form. Then, the receiving die need to de-serialize the input data signals correctly, so as to correctly obtain the communication data as transmitted.

Several embodiments are provided for describing the invention but the invention is not just limited to the embodiments.

The whole integrated circuit may be fabricated by the semiconductor fabrication processes as a semiconductor device, which may be fabricated based on stack structure of 2.5D semiconductor device. The interface of the dies to receive data may include the frame decoding circuit in association with the de-serialized circuit. In an embodiment, the interface in semiconductor structure is integrated in the circuit of the whole die.

Figure 1:
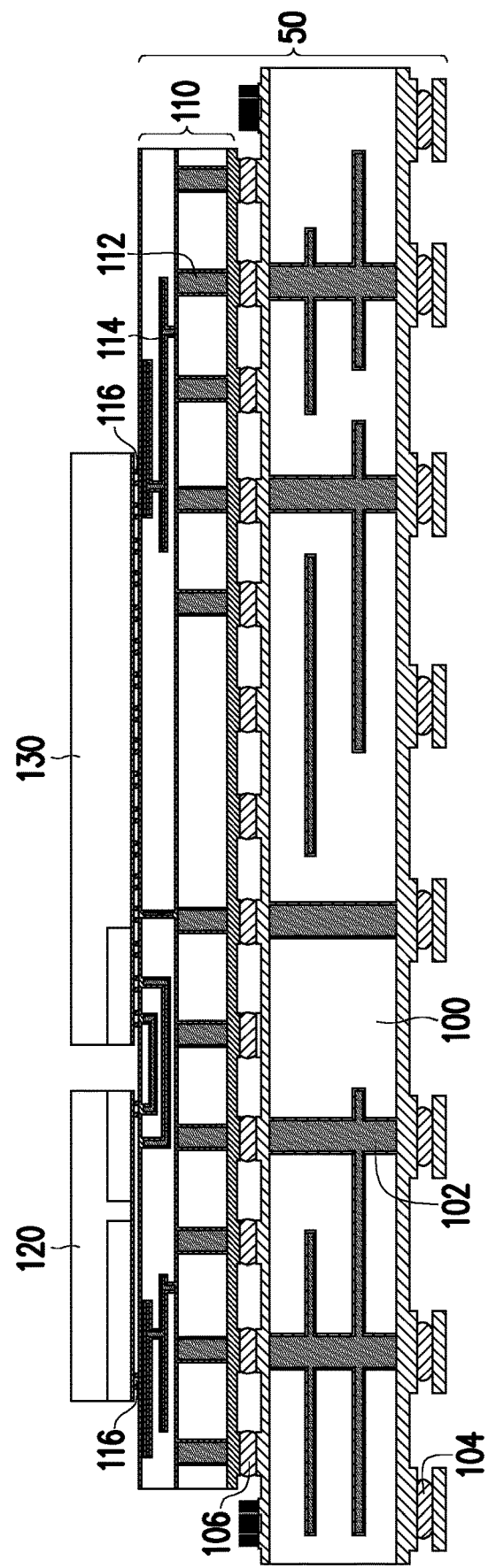
FIG. 1 is a drawing, schematically illustrating a cross-sectional stack structure of 2.5D semiconductor device with an interface, according to an embodiment of the invention.

The semiconductor fabrication is firstly described. FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top contact elements 106. The via 102 may be used for connecting from the bottom solder balls 104 to the top contact elements 106. Further, interposer or RDL 110, may be further formed on the substrate 100 with the connection of the contact elements 106. The interposer or RDL 110 may also include the TSV 112, the interconnection routing 114, and the contact elements 116. Here, the contact elements 116 depending on the fabrication process as taken may be via or contact element or any suitable connecting structure for terminal-to-terminal in contact. The invention does not limit the contact elements 106 as a specific type.

In actual application, the CoWoS or InFO platform 50 may also be implemented with additional dies, such as the ASIC die 130 and SerDes die 120. The ASIC die 130 and SerDes die 120 are connected through the routing 114 and the contact elements 116. One ASIC die 130 may connect with multiple SerDes die 120 for various peripheral communication.

Figure 2:
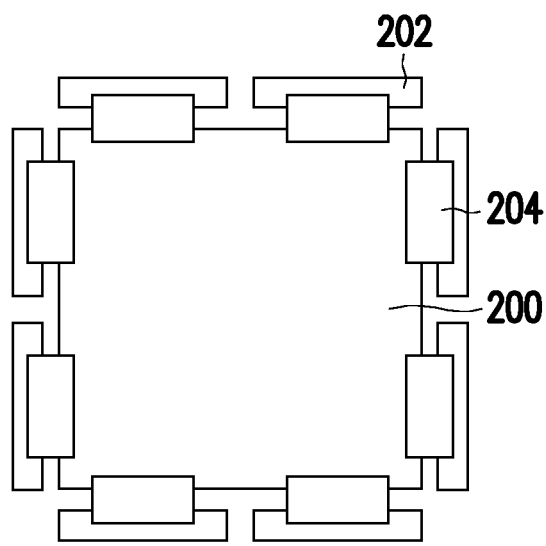
FIG. 2 is a drawing, schematically illustrating the interfaces for one die to connect to multiple other dies through the interfaces, according to an embodiment of the invention.

FIG. 2 is a drawing, schematically illustrating the interfaces for one die to connect to multiple other dies through the interfaces, according to an embodiment of the invention. Referring to FIG. 2, one IC die 200, such as a processor or ASIC die, may connect with multiple dies 202 through the interface 204. The interface 204 involves a parallel bus to communicate between the die 200 and the dies 202. The interface 204 may include routing and the contact elements in a contact element pattern, so that die 200 to die 202 may be connected.

Figure 3:
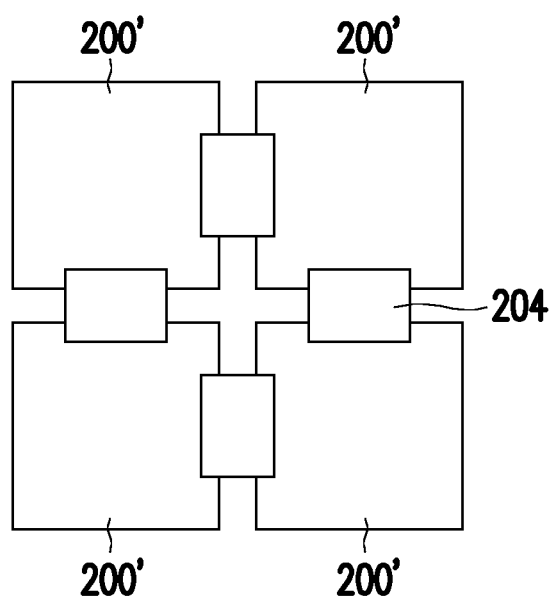
FIG. 3 is a drawing, schematically illustrating the interfaces for connection between multiple dies, according to an embodiment of the invention.

FIG. 3 is a drawing, schematically illustrating the interfaces for connection between multiple processor dies, according to an embodiment of the invention. Referring to FIG. 3, in another application, multiple processors 200' may be connected together to form a large processor with more powerful function. In this situation, these processors 200' are also connected by the interfaces 204.

As foregoing description, the 2.5D packaging process may be applied to stack various dies together side by side without substantially further consuming the device area. However, to allow the die to be more freely connected together, the contact elements in the interface 204 need to be properly arranged in compact manner and further be symmetric for receiving and transmitting signals. The communication between two die 200 to die 202 may be easily disposed at the peripheral region. Here, interface 204 may also be referring to Glink interface as provided in the market.

Figure 4:
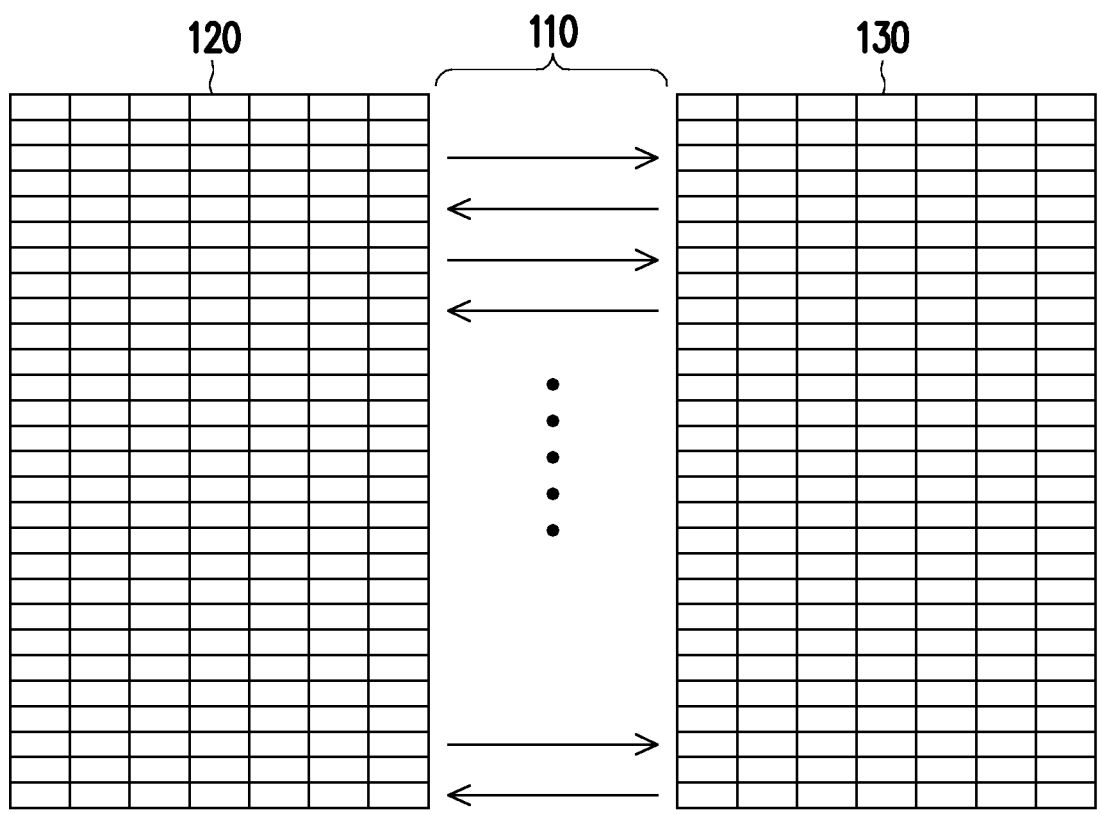
FIG. 4 is a drawing, schematically illustrating a communication between two dies based on the interface with the interposer or RDL, according to an embodiment of the invention.

FIG. 4 is a drawing, schematically illustrating a communication between two dies based on the interface with the interposer or RDL, according to an embodiment of the invention. Referring to FIG. 4, in an example, the ASIC die 130 and SerDes die 120 are communicating through the interposer or RDL 110. The contact elements of the ASIC die 130 and SerDes die 120 to contact to the interposer or RDL 110 are properly arranged. Each contact element may transmit one specific signal at the same time. As a result, the parallel bus is set up based on the contract elements. The signals at each contact elements are in a serial form, such as a bit string.

Figure 5:
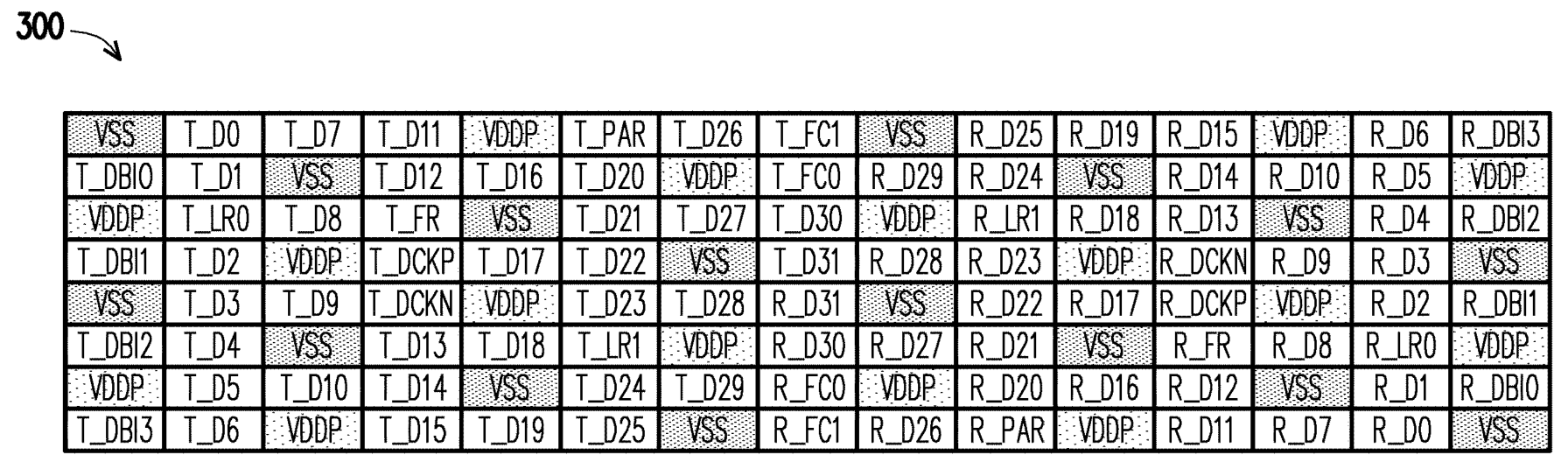

FIG. 5 is a drawing, schematically illustrating the structure of the contact element pattern, according to an embodiment of the invention. Referring to FIG. 5, the total number of the contact elements involved in the interface may be a number of signals are communicating in parallel for transmitting and receiving.

The total number of the contact elements involved in the interface may be a large number. The signals are communicating in parallel between dies for transmitting and receiving. Depending on the size of the data in one bus, a data size of 32 bits with operation voltages and other function signals are set as one slice referred to a contact element pattern 300. The contact element pattern 300 may be replicated up to a certain number, such as 8, to adapt the total data size in parallel communication. In an example, the data is corresponding to 32 bits with a sequence of R_D0 to R_D31 and T_D0 to T_D31, on which T represents the contact element for transmitting and R represents the contact element for receiving. In addition, multiple low voltage signals VSS and multiple high voltage VDDP are also included in the contact element pattern 300. In addition, various function signals are also included, including FRAME T/R_FR; Clock T/R_DCK_P/N; Flow control T/R_FC[1:0]; DBI T/R_DBI [3:0]; Parity T/R_PAR; and Lane Repair T/R_LR[1:0]. However, the contact elements for the functional signals are just not limited to the embodiment.

Table 1 is an example to define the contact elements for one transmitting (T) group or receiving (R) group. The transmitting group and the receiving group have the same number of contact elements.

TABLE 1

| Contact element type | number | definition |
| --- | --- | --- |
| Data, T/R [31:0] | 32 | Data bits synchronous to CLK |
| FRAME, T/R_FRAME | 1 | FRAME bit synchronous to CLK |
| Clock, T/R_DCK_P/N | 2 | CLK differential pair |
| Flow Control, T/R_FC[1:0] | 2 | Asynchronous and in different direction to data bus |
| DBI, T/R_DBI[3:0] | 4 | One DBI per byte, serving to invert bus content for better SSO (single sign-on) |
| Parity, T/R_PAR | 1 | One per 32 bits, serving to identify error cases |
| Lan Repair, T/R_LR[1:0] | 2 | Lane repair bits, being used to repair data, parity and DBI, not used to repair CLK, FRAME and FC signals |

Based on the interposer or RDL 110 as described above, the various signals are communicated between two dies. However, in an example, a set of parallel signals in communication may be converted into a serial form to transmit/receive through one routing with one contact element. Once the data signals in serial form is received by the IC die, the IC die would de-serialize the data signals into a parallel form.

To assure the data signal in serial form to be correctly de-serialized, in an embodiment, a frame signal is provided to define N-bit data in each set. N in an example is 8 but the invention is not limited to 8. The parameter N is determined according to the actual data transmission algorithm. Here, 8-bit data form one byte. The following example takes 8-bit signal as an example for descriptions.

Based on the packaging process, the communication physical layers of two dies may be connected through the interposer or RDL 110, which serving as a parallel bus. However, each contact element of the parallel bus transmits the serialized data.

Figure 6:
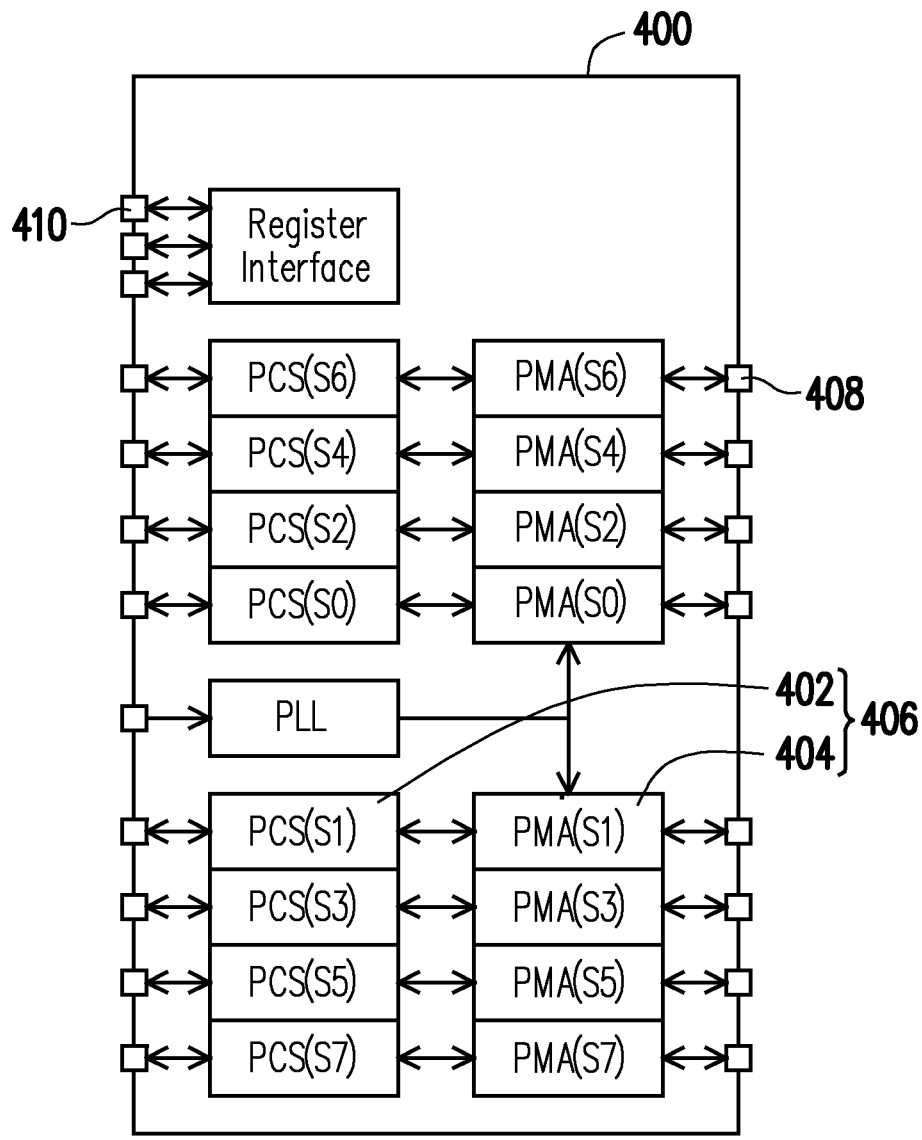
FIG. 6 is a drawing, schematically illustrating a structure of a communication physical layer, according to an embodiment of the invention.

FIG. 6 is a drawing, schematically illustrating a structure of a communication physical layer, according to an embodiment of the invention. Referring to FIG. 6, a communication physical layer 400 is a part of IC die to communicate with other IC die, which is connected by the interposer or RDL 110. In the communication physical layer 400 includes multiple interface slices 406 for handling multiple sets of parallel data, respectively. Each interface slice 406 includes a digital block Physical Coding Sublayer (PCS) 402 and analog block Physical Medium Attachment (PMA) 404. The digital block PCS 402 communicate with a user interface through a set of contact elements 410, in which the digital data are processed. The analog block PMA 404 is used to transmit and receive the data communicated between the connected two dies through a set of contact elements 408 as previous described.

In an example, eight interface slices 406, as indicated by S0, S1, . . . , S7, are implemented in one communication physical layer. The single clock PLL is for the eight interface slices 406, based on a clock tree mechanism to respectively distribute the clock to each interface slice 406.

Figure 7:
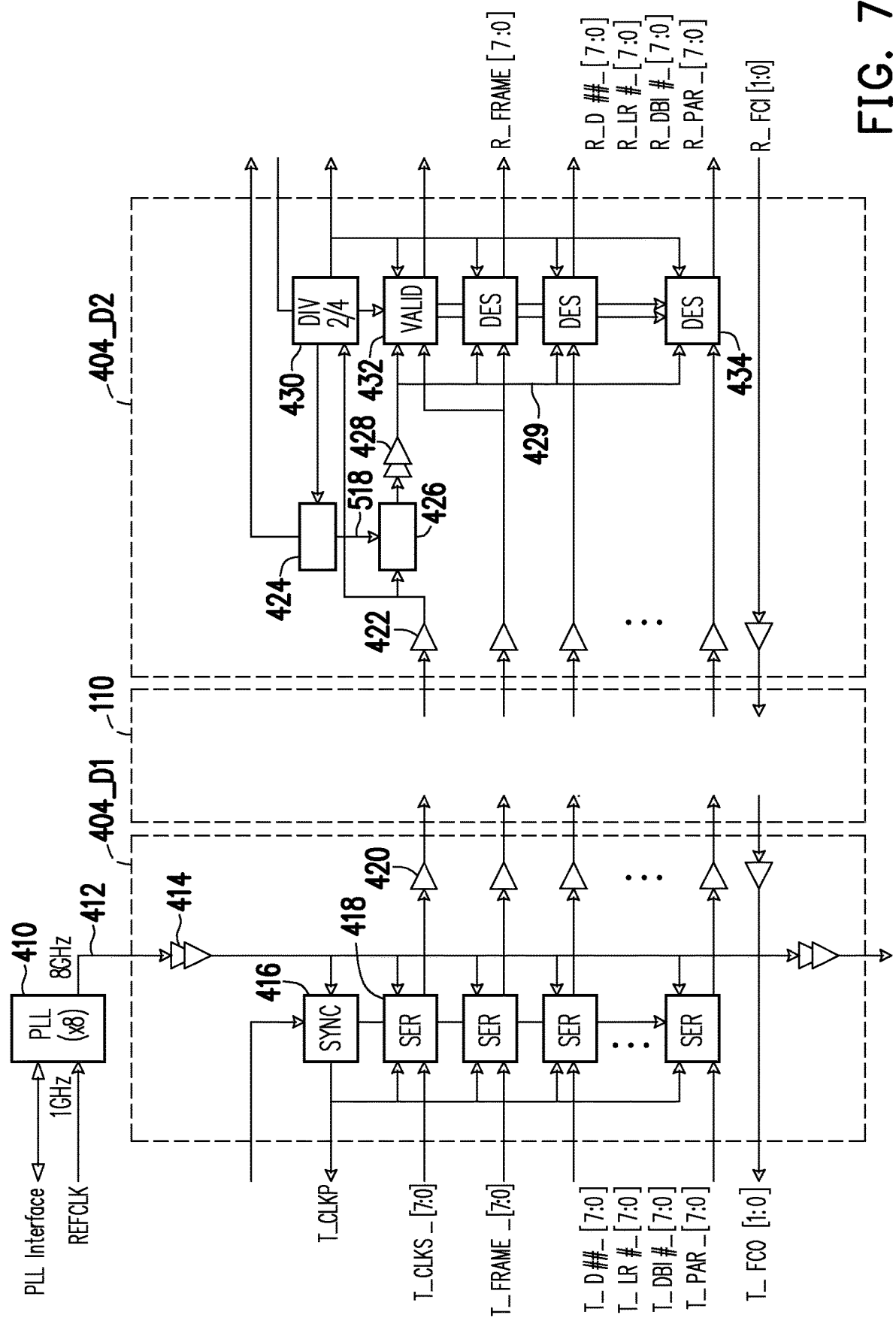
FIG. 7 is a drawing, schematically illustrating a communication between two IC dies, in which serializers and de-serializers are involved, according to an embodiment of the invention.

FIG. 7 is a drawing, schematically illustrating a communication between two IC dies, in which serializers and de-serializers are involved, according to an embodiment of the invention. Referring to FIG. 7, the communication between two dies through the analog block PMA. In an embodiment, an analog block PMA 404_D1 of a communication physical layer of one die intends to transmit data and the clock to an analog block PMA 404_D2 of a communication physical layer of another die, which is connected by the interposer or RDL 110.

As noted, various sets of parallel data are respectively serialized by the serializers 418, respectively. Each serializer 418, as also indicated by SER, corresponds to one contact element, which is connected to one contact element of the analog block PMA 404_D2 in the connected die. Various sets of parallel data with 8-bit size in an example may include the data sets as indicated by T_CLKS_[7:0], T_FRAME_[7:0], T_D ##_[7:0], T_LR #_[7:0], T_DBI #[7:0], and T_PAR_[7:0]. In addition, the clock block PLL 410 may provide the clock 412 for the serializer 418 through a clock tree 414, which would distribute the clock to all interface slices. The serializer 418 need a clock in higher frequency and the clock block PLL 410 may increase the frequency of clock by 8 times in an example. In addition, the synchronization block SYNC 416 may provide the clock T_CLKP for synchronizing the parallel data to serializers 418. The buffers 420 are connected to the serializers 418 for output the serialized data in serial signal form.

The receiving part of the analog block PMA 404_D2 in the connected die the receive the serialized data at the buffers 422. As noted, the digital clock T_CLKS_[7:0] has been serialized as a serial clock and also transmitted together with the various data sets. The analog block PMA 404_D2 includes multiple de-serializers 434, as indicated by DES 434, would de-serialize the serial data into parallel data, such as R_FRAME_[7:0], R_D ##_[7:0], R_LR #_[7:0], R_DBI #_[7:0], and R_PAR_[7:0].

In order to correctly de-serialize the serialized data, the sampling clock 429 is used. The timing of the sampling clock at the clock tree 428 is essential to successfully sample the serialized data, in which the rising edge of the sampling clock 429 needs to be set at about the middle of one data eye of one bit. Here, the double data rate (DDR) mechanism is used to transmit data.

To assure the sampling clock 429 is proper, the delay locked loop (DLL) circuit includes the master DLL circuit and the slave DLL circuit. The master DLL circuit includes a delay control 424 and a frequency divider 430. The delay locked loop (DLL) circuit including the master DLL circuit may also refer to FIG. 8.

Figure 8:
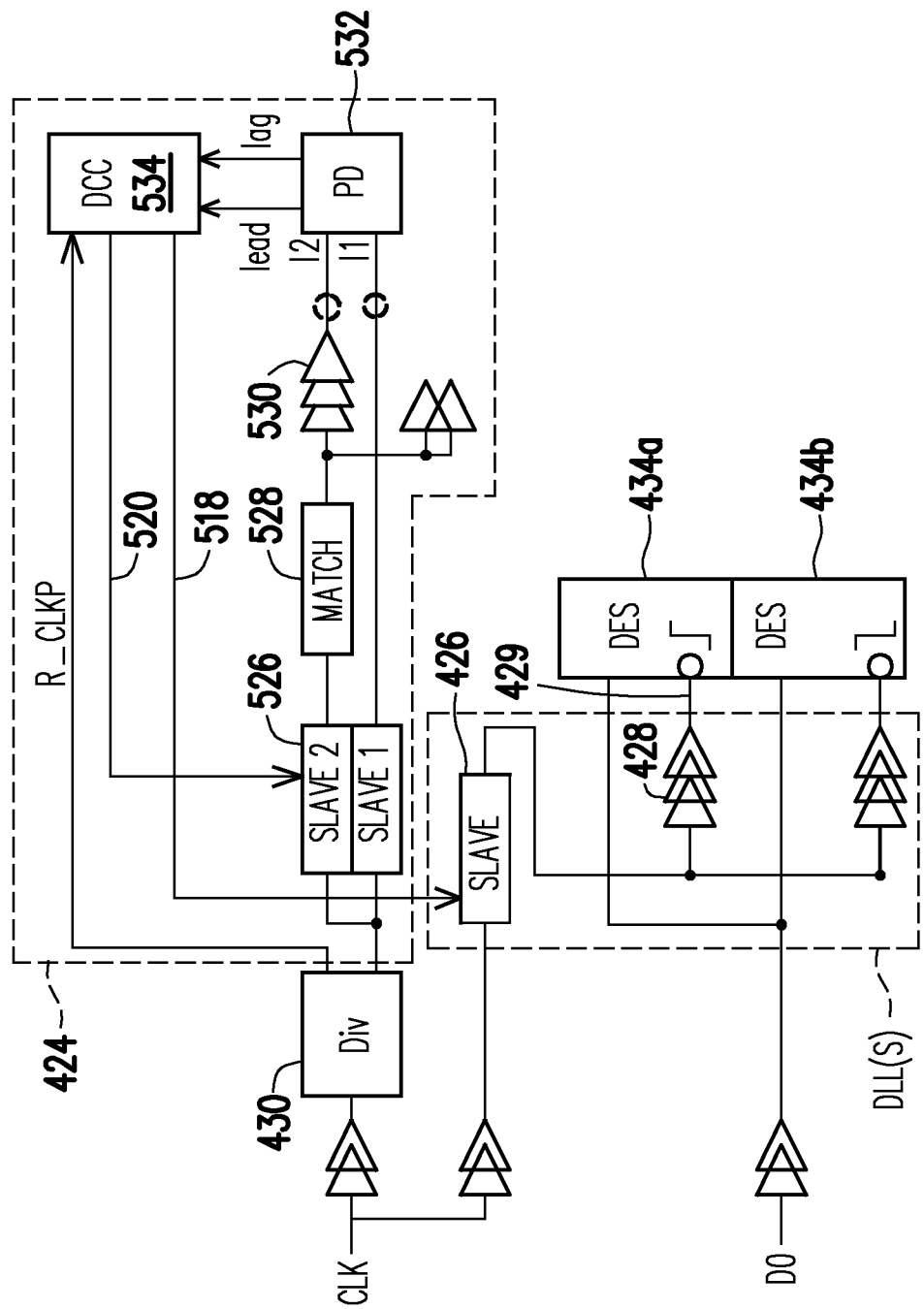
FIG. 8 is a drawing, schematically illustrating DLL circuit to provide a clock to de-serializers, according to an embodiment of the invention.

FIG. 8 is a drawing, schematically illustrating DLL circuit to provide a clock to de-serializers, according to an embodiment of the invention. Referring to FIG. 8 with a part in FIG. 7, the slave DLL circuit as indicated by DLL(S) includes an adjustable delay line 426 and a clock tree 428. The DLL(S) provides the sampling clock 429 to the DES 434 which is indicated by DES 434a and DES 434b in FIG. 8 corresponding to rising edge sampling and the falling edge sampling in DDR mechanism. However, a phase of the sampling clock 429 is controlled by the frequency divider as indicated by Div 430 and a delay control 424. The frequency divider 430 and the delay control 424 may be realized as the master DLL or DLL(M). To the DDR mechanism, the sampling clock 429 is controlled to have a delay amount with respect to the input clock CLK at the buffers 422 by 0.5 unit (UI) or 2.5 UI. One unit, corresponding to one data eye, is T/2 under the DDR mechanism, in which T is one clock cycle. In practical design, the frequency divider 430 as indicated by DIV may be used to properly reduce the frequency by factor of 2 or 4 (2/4), which is taken to be adapted in the DLL(M) 424.

Further the valid block 432 in FIG. 7 may also be used to detect whether or not the sampling clock 429 is proper and the data are valid.

Generally, the DLL circuit in an embodiment may include the master DLL circuit as indicated by DLL(M) and the salve DLL circuit as indicated by DLL(S). The input clock CLK enters both the DLL(M) and the DLL(S). The DLL(S) in an embodiment includes an adjustable delay line 426 as indicated by SLAVE and the clock tree 428. The data signal D0 in DDR would be sampled at the rising edge and the falling edge of the sampling clock 429. The sampling clock 429 are branched into two paths.

The delay amount of the adjustable delay line 426 is adjustable and would be control by the control signal 518 form the DLL(M) to have the proper delay. The DLL(M) is described as follows.

As foregoing stated, the DLL(M) includes the frequency divider 430 and the delay control 424. The delay control 424 is to find the proper delay amount for the delay SLAVE in the DLL(S). The delay control 424 may need not to be operated at high frequency, then the input clock CLK may be divided in frequency by a factor by 2 and 4 for different part in the delay control 424. The delay control 424 includes a variable delay 526, which includes a first delay line SLAVE 1 for path I1 and a second delay line SLAVE 2 for path I2. The first delay line SLAVE 1 is directly input to a phase detector (PD) 532 in the path I1. The second delay line SLAVE 2 goes through a match delay (MATCH) 528 and a clock tree 530 in the path I2. The clocks at the path I1 and the path I2 are entering to the PD 532. The PD 532 detects the phase relation between the clocks in the path I1 and the path I2, so as to provide a lead state or a lag state. The clock control 534, as also indicated by DCC, receives the lead/lag information and generates an adjusting signal 520 to the variable delay 526 to adjust the first delay line SLAVE 1 and the second delay line SLAVE 2 in loop adjustment, step by step. The adjusting mechanism would be described in FIG. 9.

The delay control 424 may replicate the DLL(S) to find a proper delay amount for the SLAVE 426. When the clocks at the path I1 and the path I2 reach to the set condition, the DCC 534 output the control signal 518 to the SLAVE 426 of the DLL(S) to actually set the delay for actually sampling the data in DES 434.

The operation of the delay control 424 is following. As to the circuit, the first delay line SLAVE 1 and the second delay line SLAVE 2 are also adjustable under control by the DCC 534. The MATCH 528 replicates from the SLAVE 426, which is set at the minimum delay. The clock tree 530 is also replicating from the clock tree 428. In other words, the MATCH 528 and the clock tree 530 together replicate the actual path of DLL(S) for the DES 434a and DES 434b at the condition that the delay amount of the SLAVE is at the minimum delay. As also stated in FIG. 8 in an embodiment, based on the DDR mechanism, the DES 434a may use rising edge for sampling and the DES 434b may use the falling edge for sampling data. However, in an embodiment, a single DES 434 may use both the rising edge and the falling edge for sampling data, in an embodiment. The invention is not limited to a specific type for the de-serializers. Based on this replicating circuit, the proper control signal 518 may be obtained to actually adjust the delay of the SLAVE 426 of the DLL(S).

Figure 9:
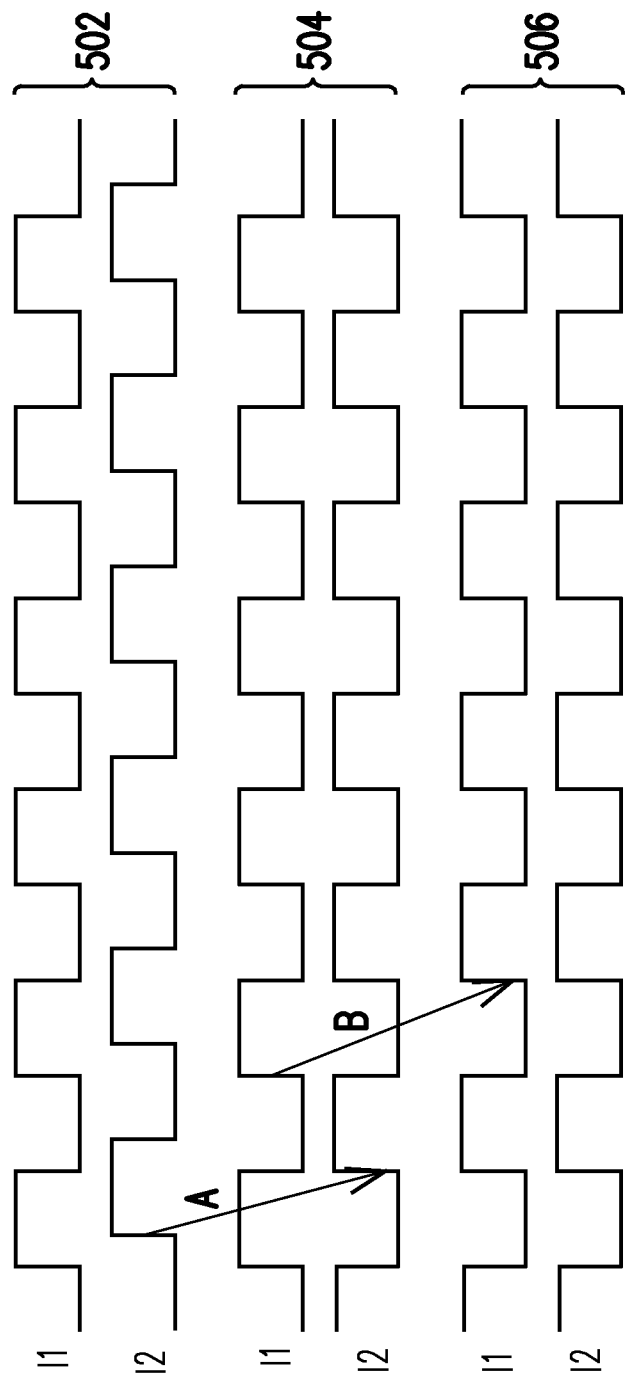
FIG. 9 is a drawing, schematically illustrating the clock adjustment in master DLL, according to an embodiment of the invention.

FIG. 9 is a drawing, schematically illustrating the clock adjustment in master DLL, according to an embodiment of the invention. Referring to FIG. 9, based on the circuit in the delay control 424 in loop adjustment, the first delay line SLAVE 1 and the second delay line SLAVE 2 are set to the state of zero delay for the initial state. The signal status 502 for the two clocks at the path I1 and path I2 is schematically illustrated. The clock at the path I2 has delay due to the MATCH 528 and the clock tree 530 as replicating from the clock tree 428. In the signal status 504, the clock at the path I2 is adjusted first by the adjusting signal 520, in which the rising edge of the clock I2 is shifted step-by-step in the loop adjustment until the rising edge of the clock I2 is matched to the falling edge of the clock at the path I1. Then, the second delay line SLAVE 2 is locked by a delay A. The signal status 506, the clock at the path I1 is adjusted after the second delay line SLAVE 2 is locked until the rising edge of the clock at the path I1 is matched to the rising edge of the clock at the path I2. The clock at the path I1 is also locked a delay B. The DCC 534 determines the control signal 518 for the DLL(S) according to the condition.

In an embodiment, the control signal 518 is set to a delay C in Eq. 1 and Eq. 2:

$$C=(T/4)-(B-A) \text{ when } (B-A) \leq T/4, \quad (1)$$

$$C=(5T/4)-(B-A) \text{ when } (B-A) > T/4. \quad (2)$$

where T is a clock cycle. The clock cycle T as usually known is a time interval between adjacent two rising edges of the clock signal. In an embodiment, as realized, Eq. 1 may be used when clock with match is below 0.5×UI and Eq. 2 may be used when the clock with match is between 0.5×UI and 2.5×UI.

The delay C is converted into the control signal 518 to adjust the delay amount of the SLAVE 426 in the DLL(S) and then the sampling clock 429 is properly generated for use in the DES 434 (FIG. 7) or a pair of DES 434a and DES 434b (FIG. 8). The delay C may effectively adjust the delay amount of the SLAVE 426 to be located at 0.5 UI or 2.5UI. One unit (UI), corresponding to one data eye, is T/2 under the DDR mechanism, in which T is one clock cycle.

FIG. 10 and FIG. 11 are a drawing, schematically illustrating the adjustment effect of the clock, according to an embodiment of the invention. Referring to FIG. 10, the clock 512 is the original clock without delay. Due to the double data rate DDR mechanism, 1UI is T/2. In association with operation in DCC 534 of DLL(M) as shown in FIG. 8, one unit is divided into 128 steps in an example, so as to adjust step by step in the loop adjustment. The clock 514 is the clock at the path I2 corresponding to the initial state with a certain delay but less than 0.5 UI. The clock 516 is the intended clock with the proper delay after adjustment by the clock signal 518 in FIG. 8. The rising edge of the clock 518 would be about located at the middle of one unit, which is corresponding to one data eye cycle. Corresponding to Eq. 1 as an embodiment, the rising edge of the clock 518 is shifted to the middle location. Referring to FIG. 11, corresponding to Eq. 2 as an embodiment, if the clock 514 in the path I2 has the delay greater than 0.5 UI, then the clock 518 is shifted to the middle location with addition of one clock cycle T.

Alternatively, the communication physical layer 400 in FIG. 6 may also implemented with a built-in self-test (BIST)

block for performing a BIST procedure for sampling data to set the delay amount of the adjustable delay line SLAVE of the slave DLL, DLL(S), at an optimized condition. The BIST procedure of the BIST block may be triggered to determine a delay range of the delay amount with capability to correctly sample test data, and determine the optimized condition in the delay range. The BIST procedure may set the delay amount to check over the whole data eye and find the optimized delay amount.

Further, the delay amount may also be adjusted according to the variance of operation voltage and/or temperature of the circuit. The operation voltage and the temperature may cause the change of the width of the clock cycle and delays of various components. Then, in an embodiment, the delay amount may be proportionally adjusted according to the actual width of the clock cycle and delays of the components.

The DLL circuit is provided in the invention to provide the proper delay with respect to the input clock which is transmitted together with the serial data through the parallel bus in the interposer or RDL 110. The DLL circuit provides a sampling clock with proper delay to sample the data eye in the de-serializers.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit for providing a sampling clock to de-serializers in a communication physical layer, comprising:
   a slave delay lock loop (DLL), to receive an input clock and provide the sampling clock to the de-serializers; and
   a master DLL, receiving the input clock and outputting a control signal to the slave DLL to estimate a delay of the slave DLL and adjust a delay amount of the sampling clock of the slave DLL,
   wherein the master DLL replicates a circuit of the slave DLL and a loop detection and determines the control signal for output.

2. The circuit as recited in claim 1, wherein the slave DLL includes:
   an adjustable delay line; and
   a clock tree, connected to the delay line to provide the sample clock.

3. The circuit as recited in claim 2, wherein the master DLL includes:
   a first delay line, receiving the input clock;
   a second delay line, receiving the input clock;
   a match delay connected to the second delay line, wherein the second delay line is replicated from the adjustable delay line at a minimum delay state;
   a replicated clock tree connected to the match delay, wherein the replicated clock tree replicates the clock tree of the slave DLL;
   a phase detector, receiving a first clock signal directly from the first delay line and a second clock signal from the second delay line through the match delay and the replicated clock tree, wherein the phase detector provides a phase detection state between the first clock signal and the second clock signal; and
   a clock control unit, receiving the phase detection state to determine whether or not the phase detection state reaches to a set condition,
   wherein the clock control unit provides an adjusting step to the first delay line and the second delay line in each loop of a loop adjustment when the phase detection state does not reach to an accepted condition, and
   wherein the clock control unit provides the control signal to the slave DLL when the phase detection state does reach to the set condition.

4. The circuit of claim 3, wherein the phase detection state between the first clock signal and the second clock signal determines whether the first clock signal is leading or lag from the second clock signal.

5. The circuit of claim 4, wherein the loop adjustment as configured in the clock control unit includes:
   adjusting the second delay line by delaying a first amount A to cause a rising edge of the second clock reaching to a falling edge of the first clock signal at zero delay and then locking the second clock signal;
   adjusting the first delay line by delaying a second amount B to cause a rising edge of the first clock signal reaching to a rising edge of the second clock signal as locked; and
   converting the delay amount into the control signal to adjust the delay amount of the adjustable delay line of the slave DLL, and the delay amount is:
   $(T/4)-(B-A)$ when $(B-A) \leq T/4$, where T is a clock cycle with a time interval between adjacent two rising edges of the clock signal; and
   $(5T/4)-(B-A)$ when $(B-A) > T/4$.

6. The circuit of claim 5, wherein the delay amount is changed due to a variance of operation voltage and/or temperature of the circuit.

7. The circuit of claim 2, further comprising a frequency divider to divide a frequency of the input clock and then output to the master DLL.

8. The circuit of claim 2, further comprising a built-in self-test (BIST) block for performing a BIST procedure of sampling data to set the delay amount of the adjustable delay line of the slave DLL at an optimized condition.

9. The circuit of claim 8, wherein during an idle state, the BIST procedure of the BIST block is triggered to determine a delay range of the delay amount with capability to correctly sample test data, and determine the optimized condition in the delay range.

10. A communication physical layer, comprising:
    a plurality of buffers, parallelly receiving an input clock and a plurality of data signals from an external die through a connection interface, each of the data signals containing a set of serial data;
    a delay lock loop (DLL) circuit, receiving the input clock, to provide a sampling clock;
    a plurality of de-serializers respectively receiving the data signals and the sampling clock to de-serialize the set of serial data,
    wherein the DLL circuit comprises:
      a slave DLL, to receive the input clock and provide the sampling clock to the de-serializers; and
      a master DLL, receiving the input clock and outputting a control signal to the slave DLL to adjust a delay amount of the sampling clock of the slave DLL,
      wherein the master DLL replicates a circuit of the slave DLL and a loop detection and determines the control signal for output.

11. The communication physical layer as recited in claim 10, wherein the slave DLL includes:
    an adjustable delay line; and
    a clock tree, connected to the delay line to provide the sample clock.

12. The communication physical layer as recited in claim 11, wherein the master DLL includes:
a first delay line, receiving the input clock;
a second delay line, receiving the input clock;
a match delay connected to the second delay line, wherein the second delay line is replicated from the adjustable delay line at a minimum delay state;
a replicated clock tree connected to the match delay, wherein the replicated clock tree replicates the clock tree of the slave DLL;
a phase detector, receiving a first clock signal directly from the first delay line and a second clock signal from the second delay line through the match delay and the replicated clock tree, wherein the phase detector provides a phase detection state between the first clock signal and the second clock signal; and
a clock control unit, receiving the phase detection state to determine whether or not the phase detection state reaches to a set condition,
wherein the clock control unit provides an adjusting step to the first delay line and the second delay line in each loop of a loop adjustment when the phase detection state does not reach to an accepted condition, and
wherein the clock control unit provides the control signal to the slave DLL when the phase detection state does reach to the set condition.

13. The communication physical layer of claim 12, wherein the phase detection state between the first clock signal and the second clock signal determines whether the first clock signal is leading or lag from the second clock signal.

14. The communication physical layer of claim 13, wherein the loop adjustment as configured in the clock control unit includes:
adjusting the second delay line by delaying a first amount A to cause a rising edge of the second clock reaching to a falling edge of the first clock signal at zero delay and then locking the second clock signal;
adjusting the first delay line by delaying a second amount B to cause a rising edge of the first clock signal reaching to a rising edge of the second clock signal as locked; and
converting the delay amount into the control signal to adjust the delay amount of the adjustable delay line of the slave DLL, and the delay amount is:
(T/4)−(B−A) when (B−A)≤T/4, where T is a clock cycle with a time interval between adjacent two rising edges of the clock signal; and
(5T/4)−(B−A) when (B−A)>T/4.

15. The communication physical layer of claim 14, wherein the delay amount is changed due to a variance of operation voltage and/or temperature of the circuit.

16. The communication physical layer of claim 11, further comprising a frequency divider to divide a frequency of the input clock and then output to the master DLL.

17. The communication physical layer of claim 11, further comprising a built-in self-test (BIST) block for performing a BIST procedure of sampling data to set the delay amount of the adjustable delay line of the slave DLL at an optimized condition.

18. The communication physical layer of claim 17, wherein during an idle state, the BIST procedure of the BIST block is triggered to determine a delay range of the delay amount with capability to correctly sample test data, and determine the optimized condition in the delay range.

* * * * *